(12) United States Patent
Reents et al.

(10) Patent No.: US 9,526,183 B2
(45) Date of Patent: *Dec. 20, 2016

(54) GALVANIC PROCESS FOR FILLING THROUGH-HOLES WITH METALS, IN PARTICULAR OF PRINTED CIRCUIT BOARDS WITH COPPER

(71) Applicant: Atotech Deutschland GmbH, Berlin (DE)

(72) Inventors: Bert Reents, Berlin (DE); Thomas Pliet, Berlin (DE); Bernd Roelfs, Berlin (DE); Toshiya Fujiwara, Tokyo (JP); Rene Wenzel, Berlin (DE); Markus Youkhanis, Berlin (DE); Soungsoo Kim, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/159,943

(22) Filed: May 20, 2016

(65) Prior Publication Data

US 2016/0270241 A1 Sep. 15, 2016

Related U.S. Application Data

(63) Continuation of application No. 11/661,704, filed as application No. PCT/EP2005/009332 on Aug. 30, 2005, now Pat. No. 9,445,510.

(30) Foreign Application Priority Data

Sep. 20, 2004 (DE) ........................ 10 2004 045 451

(51) Int. Cl.
C25D 5/18 (2006.01)
C25D 3/38 (2006.01)
(Continued)

(52) U.S. Cl.
CPC ................ H05K 3/423 (2013.01); C25D 3/38 (2013.01); C25D 5/18 (2013.01); C25D 7/12 (2013.01);
(Continued)

(58) Field of Classification Search
CPC .................................. C25D 5/18; C25D 21/12
See application file for complete search history.

(56) References Cited

U.S. PATENT DOCUMENTS 4,496,436 A 1/1985 Inoue
4,683,036 A 7/1987 Morrissey et al.
(Continued)

FOREIGN PATENT DOCUMENTS

DE 2739427 3/1978
DE 4126502 2/1993
(Continued)

OTHER PUBLICATIONS

"Fill, v.". OED Online. Jun. 2014. Oxford University Press. http://www.oed.com/view/Entry/70216 (accessed Aug. 12, 2014).
(Continued)

*Primary Examiner* — James Lin
*Assistant Examiner* — Brian W Cohen
(74) *Attorney, Agent, or Firm* — Renner, Otto, Boisselle & Sklar, LLP

(57) ABSTRACT

The present invention relates to a galvanic process for filling through-holes with metals. The process is particularly suitable for filling through-holes of printed circuit boards with copper.

20 Claims, 3 Drawing Sheets

Formation of a narrow part due to preferred copper-plating in the center of a through-hole in a printed circuit board.

(51) Int. Cl.
*C25D 21/12* (2006.01)
*C25D 7/12* (2006.01)
*H05K 3/42* (2006.01)
*H05K 1/11* (2006.01)

(52) U.S. Cl.
CPC ............... *C25D 21/12* (2013.01); *H05K 1/115* (2013.01); *H05K 3/427* (2013.01); *H05K 2201/09563* (2013.01); *H05K 2203/1476* (2013.01); *H05K 2203/1492* (2013.01)

(56) References Cited

U.S. PATENT DOCUMENTS

| | | |
|---|---|---|
| 4,975,159 A | 12/1990 | Dahms |
| 5,425,862 A | 6/1995 | Hartmann et al. |
| 5,433,840 A | 7/1995 | Dahms et al. |
| 5,972,192 A | 10/1999 | Dubin et al. |
| 6,071,398 A | 6/2000 | Martin et al. |
| 6,099,711 A | 8/2000 | Dahms et al. |
| 6,132,584 A | 10/2000 | Hubel |
| 6,238,529 B1 | 5/2001 | Geissler et al. |
| 6,458,696 B1 | 10/2002 | Gross |
| 6,793,795 B1 | 9/2004 | Meyer et al. |
| 6,835,294 B2 | 12/2004 | Tsuchida et al. |
| 7,220,347 B2 | 5/2007 | Isono et al. |
| 2002/0015833 A1 | 2/2002 | Takahashi et al. |
| 2003/0010642 A1 | 1/2003 | Taylor et al. |
| 2003/0036269 A1 | 2/2003 | Shimo et al. |
| 2003/0102223 A1 | 6/2003 | Shimo et al. |
| 2003/0221966 A1 | 12/2003 | Bonkass et al. |
| 2003/0221969 A1 | 12/2003 | Tomisaka et al. |
| 2004/0011654 A1 | 1/2004 | Nakamura |
| 2004/0154926 A1 | 8/2004 | Sun et al. |
| 2005/0121314 A1 | 6/2005 | Inoue et al. |

FOREIGN PATENT DOCUMENTS

| | | |
|---|---|---|
| DE | 3836521 | 4/1995 |
| DE | 19915146 | 7/2000 |
| DE | 10113767 | 10/2001 |
| DE | 4225961 | 11/2001 |
| DE | 10236200 | 5/2003 |
| DE | 10223957 | 12/2003 |
| DE | 10325101 | 12/2004 |
| EP | 0645950 | 9/1998 |
| EP | 1132500 | 3/2001 |
| EP | 1194023 | 4/2002 |
| EP | 1219729 | 7/2002 |
| EP | 1264918 | 12/2002 |
| EP | 1475463 | 11/2004 |
| JP | 2000-173949 | 6/2000 |
| JP | 2001-303289 | 10/2001 |
| JP | 2002141440 | 5/2002 |
| JP | 2003-328185 | 11/2003 |
| JP | 2004204351 | 7/2004 |
| JP | 2004311919 | 11/2004 |
| JP | 2005093934 | 4/2005 |
| TW | 583346 | 4/2004 |
| TW | 595297 | 6/2004 |
| WO | 02086196 | 10/2002 |
| WO | 2004081262 | 9/2004 |
| WO | 2004107834 | 12/2004 |

OTHER PUBLICATIONS

The European Technology and Trend Report 2001/2002 Concerning Printed Circuit Boards with High Integration Densities pp. 44-47.

Fig. 1a: Formation of a narrow part due to preferred copper-plating in the center of a through-hole in a printed circuit board.
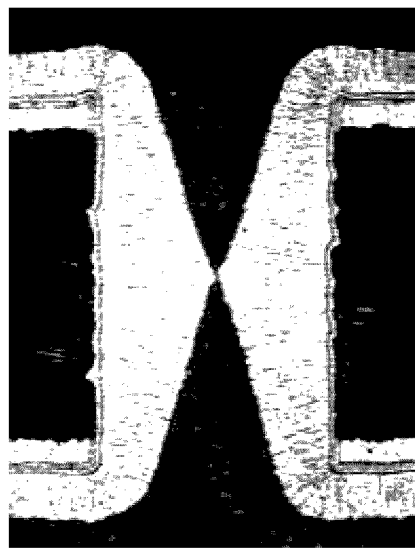
Fig. 1b: Formation of a narrow part due to preferred copper-plating in the center of a through-hole in a printed circuit board.
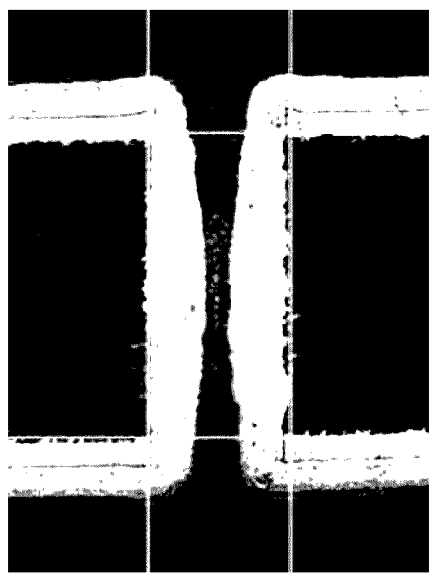

Fig. 2: Filled through-hole after formation of a narrow part in the hole center and subsequent filling of the same.
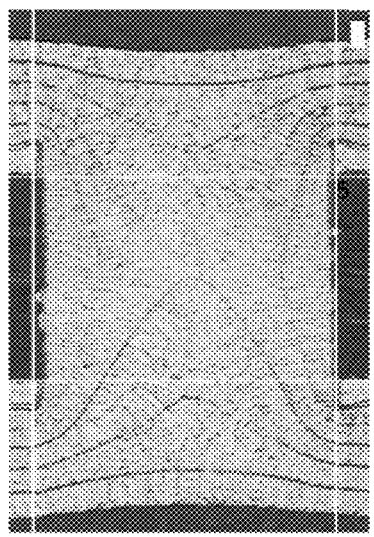

Fig. 3: Pulse reverse current diagram with phase-shift and pulse pause.
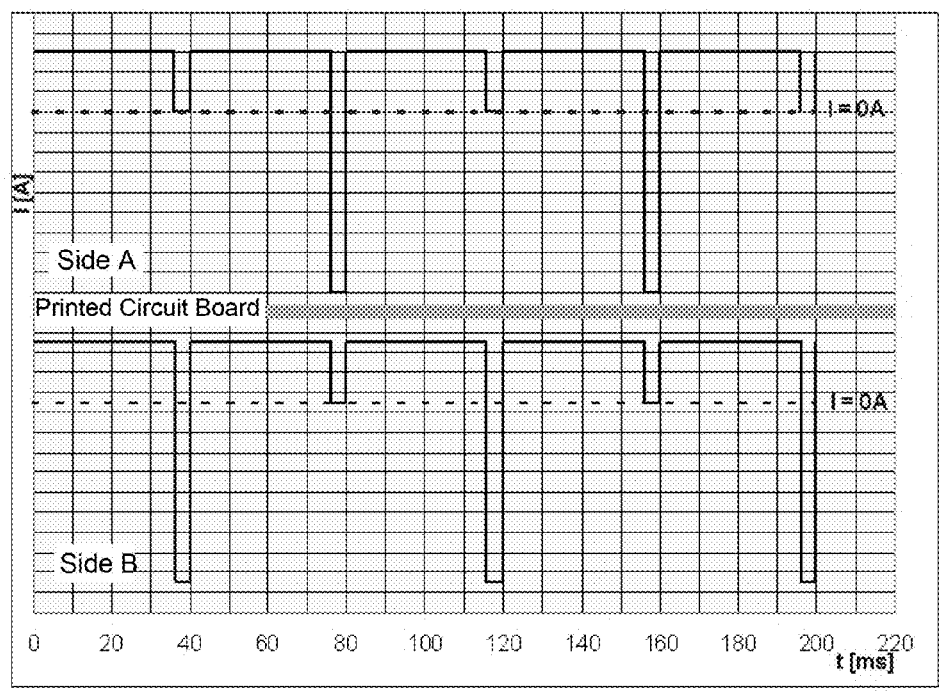

GALVANIC PROCESS FOR FILLING THROUGH-HOLES WITH METALS, IN PARTICULAR OF PRINTED CIRCUIT BOARDS WITH COPPER

CROSS-REFERENCE TO RELATED APPLICATIONS

The present application is a continuation of U.S. application Ser. No. 11/661,704, filed on 22 Dec. 2008, now U.S. Pat. No. 9,445,510 B2, which is a U.S. National Stage Application based on and claiming benefit and priority under 35 U.S.C. §371 of International Application No. PCT/EP2005/009332, filed 30 Aug. 2005, which in turn claims benefit of and priority to German Application No. 10 2004 045 451.5 filed 20 Sep. 2004, the entirety of each of which is hereby incorporated herein by reference.

FIELD OF THE INVENTION

The present invention relates to a galvanic process for filling through-holes with metals. The process is particularly suitable for filling through-holes of printed circuit boards with copper. The process provides durable fillings even in the case of small hole diameters, undesired inclusions in the through-hole can be avoided. Furthermore, the filling exhibits very good thermal conductivity.

BACKGROUND

The ever increasing miniaturization of electronic components simultaneously leads to an increase in the integration density. In printed circuit boards the trend towards miniaturization is reflected in the following construction parameters: reduction of pad diameters and conductor width/conductor gap as well as improved registration and increase in the number of layers (cf. *Der europäische Technologie- und Trendbericht* 2001/2002 *Ober Leiterplatten mit hohen Integrationsdichten*[1]).

[1]The European Technology and Tred Report 2001/2002 Concerning Printed Circuit Boards with High Integration densities Printed circuit boards having these properties are generally referred to as printed circuit boards with high integration density (so-called High Density Interconnection or HDI).

An important aspect in such HDI circuits in printed circuit board production is the filling of through-holes (so-called via-holes). The filling of the through-holes puts extremely high requirements on process control. The most different types of drill holes have to be taken into account, the various requirements on the filler materials have to be met and the subsequent working steps in a printed circuit board have to be taken into account.

The main focus of the present invention is the filling of through-holes in printed circuit boards which go through the entire board (Plated Through Hole, PTH) and of interior vias (buried vias).

In principle, the process is suitable for filling through-holes in the most different workpieces, in particular board-shaped workpieces and board-shaped electric circuit carriers containing through-holes.

The closing of the through-holes is necessary inter alia so as to prevent the deposition of solder on the components, to achieve a high integration density and to improve the electrical properties. In multi-layer printed circuit boards inclusions (of air, solvent, etc.) in the holes might occur during the laminating of the next build-up layer, which inclusions later on in the case of thermal stresses lead to bulges and, consequently, cracks in the next layer.

Thus, the main requirements to be fulfilled by the filler materials for through-holes are:
the absence of solvents
good adhesive properties to the sleeve and solder resist
resistance to process chemicals in subsequent steps (e.g. galvanic metallization with nickel, gold or tin).
resistance in hot air leveling processes.

In the state of the art various processes for filling through-holes are described.

In the simplest case the holes are filled using a specially adjusted solder resist. They have the advantage to offer that in the case of high integration density no impairment is caused in the resolution by the via filler which necessarily protrudes like a rivet head. However, what is disadvantageous is the danger of solvent inclusions which can abruptly evaporate in subsequent process steps, such as tinning, and, thus, tear open the cover.

However, this process is not suitable for closing through-holes in inner layers. Here, the inner layers have to be completely closed in order to avoid inclusions. For this process plugging is widely used because by means of this process it is possible by means of copper-plating the filled through-holes to create an inner layer which can be structured without any limitations.

As filler material various dielectrics such as resin-coated copper foils (RCC) or photo-dielectric liquid or dry films are used.

EP 0 645 950 B1 describes a process for producing multi-layered circuit substrates. As filler material for through-holes thermosetting resins are used chosen from the group consisting of phenolic resin and epoxy resin. Furthermore, as a conductive substance at least one metal powder chosen from the group consisting of silver, nickel, copper and an alloy thereof is added to the resin.

As a rule, the plugging is done after the printed circuit board has been drilled and the drill holes finally metallized, however, before the structuring. After the vias have been filled and the plugging paste has been cured, the latter is mechanically leveled since due to the filling process it exhibits a slight rivet head. Often, a metallization of the paste with copper is subsequently carried out so that a continuous copper layer is created as final layer. To put it simply, the following steps are required:
drilling
metallizing the sleeve
plugging
brushing, grinding
metallizing the plugging paste
applying the next build-up layer.

EP 1 194 023 A1 describes the manufacturing of HDI printed circuit boards by filling through-holes with conductive pastes, wherein the curing of the paste can occur at the same time as the molding of the basic material so that an electric contact of interior layers results.

However, the processes involve much outlay and cause a great deal of the process costs in the manufacture of HDI printed circuit boards. Furthermore, for each layout on the printed circuit board a different printing mask has to be used. Therefore, the process cannot be universally used.

In the case of highly different drill hole diameters on the printed circuit board the printing process is difficult.

SUMMARY

Therefore, it is the object of the present invention to develop a process which avoids the disadvantages mentioned and provides a simple process for reliably filling the through-holes of a workpiece with nearly no inclusions. The process can be used in particular for filling the through-holes in printed-circuit boards with copper.

A further object of the invention is to achieve a high performance in the electrolytic metallization. In the present case, this means that, on the one hand, the current density during the electrolytic metallization of a printed circuit board has to be as high as possible in order to achieve a short working time and, on the other hand, that the amount of metal deposited on the surface of a printed circuit board is to be as small as possible.

The object is achieved by using the inventive process for filling through-holes of a workpiece with metals comprising the following process steps:
(i) Bringing in contact the workpiece containing through-holes with a metal-deposition electrolyte and applying a voltage between the workpiece and at least one anode so that a current flow is supplied to the workpiece, wherein the current flow is chosen such that in accordance with FIG. 1 a preferred deposition occurs in the center of the through-holes and, consequently, the through-holes completely or almost completely grow together;
(ii) Further bringing in contact the workpiece with a metal-deposition electrolyte and applying a voltage between the workpiece and at least one anode so that a current flow is supplied to the workpiece, wherein the through-holes obtained in step (i) which are completely or almost completely divided into to halves are filled by the metal up to the desired degree in accordance with FIG. 2.

By using the inventive two-step process it becomes possible for the first time to fill a through-hole with a pure metal layer, in contrast to the state-of-the-art processes for filling which use pastes—mostly conductive—since up to now it has been assumed that the production of a compact metal layer is not possible with the required durability and the desired properties.

In the conventional metallization of holes, for example in printed circuit boards, at first an almost identical scattering can be observed at the ends of the holes as well as in their center. During the metal-deposition the aspects ratio changes and the scattering decreases in the drill hole. This leads to increased metal-deposition at the ends of the drill holes which grow together before the interior is fillingly metallized. Thus, undesired inclusions are left in the holes, in particular remainders of the metallization bath.

BRIEF DESCRIPTION OF THE DRAWINGS

Exemplary embodiments of the invention are described herein with reference to the drawings, in which:

FIG. 1a is a diagram depicting a V-shaped deposit located m a through-hole of a workpiece;

FIG. 1b is a diagram depicting a rounded narrow shaped deposit located in a through-hole of a workpiece;

FIG. 2 is a diagram depicting a through-hole of a workpiece after formation of a narrow part in the hole center and subsequent filling of the through-hole; and FIG. 3 is a diagram depicting a pulse reverse current with a phase-shift and a pulse pause.

DETAILED DESCRIPTION

The present invention is based on the idea to create in the first step of a special deposition technique two holes from the through-hole by completely or almost completely filling the hole center, which two holes are each closed at one end close to the hole center (cf. FIG. 1). The shape of the deposit in the area of the through-hole center can be V-shaped, as is shown in FIG. 1a, or it can be in the shape of a rounded narrow part (cf. FIG. 1b). This shape of the deposit can be achieved by increased scattering in the area of the through-hole center so that here an increased deposition of metal compared to the ends of the through-hole can be observed.

In printed circuit board production, a preferred field of application of the present invention, these holes are also referred to as blind holes or blind vias. In a second metallization step the thus created blind vias are then filled with metal (cf. FIG. 2).

Processes for filling blind vias are actually known and described in the state of the art.

EP 1 264 918 A1 describes an electrolytic copper deposition process which is particularly suitable for filing micro blind vias. Here, the use of inert anodes in a dummy plating phase helps to maintain and improve the fillability of the electrolyte.

According to EP 1 219 729 A1 chemical substances such as formaldehyde but also oxidizing agents are used in order to lengthen the period of stability of the metallization bath, which is particularly suitable for filling micro blind vias. As additives sulfur-containing substances with sulfonic acid groups as well as thiol-reactive compounds are used.

DE 103 25 101 describes a process for filling micro blind vias characterized by the following steps:
(i) Using a bath electrolyte for galvanic plating with metallic coatings comprising metals salts, acids and organic additives, wherein the bath contains an inorganic matrix comprising 15-60 g/l copper, 40-300 g/l sulfuric acid and 20-150 mg/l chloride and the organic additives comprise brightening agents, wetting agents and further additives chosen from polyamides, polyamines, lactam alkoxylates, thiourea, oligomeric and polymeric phenazonium derivatives and aminotriphenylmethane dyes,
(ii) operating the bath with a direct current at a density of 0.5-2.5 A/dm$^2$, or current pulses at an effective current density of 0.5-10 A/dm$^2$,
(iii) withdrawing part of the electrolyte from the galvanic bath,
(iv) adding an oxidizing agent to the part which has been withdrawn,
(v) optionally irradiating the withdrawn electrolyte with UV light and
(vi) recycling the withdrawn part to the galvanic bath and supplementing the organic additives destroyed by the oxidation treatment.

In a preferred embodiment of the present invention the process serves for filing the through-holes in printed circuit boards with a maximum height of 3.5 mm, a preferred height of 0.025-1 mm and a particularly preferred height of 0.05-0.5 mm as well as a diameter of 1000 µm at most, preferably 30-300 µm and most preferably 60-150 µm.

In the inventive process for filling through-holes of a workpiece with metals, in principle, every electrolyte suitable for galvanic metal-deposition can be used, such as electrolytes for depositing gold, tin, nickel or alloys thereof. The preferred metal is copper.

It has been shown that for copper-deposition electrolytes having the composition described in the following provide the best results:

Copper can be given into the electrolyte as copper sulfate pentahydrate ($CuSO_{4x}5H2O$) or as copper sulfate solution. The working range is between 15-75 g/l copper.

Sulfuric acid ($H_2SO_4$) is added as 50-96% solution. The working range is between 20-400 g/l, preferably 50-300 g/l.

Chloride is added as sodium chloride (NaCl) or as hydrochloric acid solution (HCl). Here, the working range of chloride is between 20-200 mg/l, preferably 30-60 mg/l.

Furthermore, the electrolyte preferably comprises brightening agents, leveling agents and wetting agents as organic additives.

Usually, wetting agents are oxygen-containing, high-molecular compounds in concentrations of 0.005-20 g/l, preferably 0.01-5 g/l. Examples are given in

TABLE 1

| Wetting agent |
| --- |
| Carboxymethylcellulose |
| Nonylphenolpolyglycolether |
| Octanediol-bis-(polyalkylene glycol ether) |
| Octanol polyalkylene glycol ether |
| Oleic acid polyglycol ester |
| Polyethylene glycolpolypropylene glycol copolymerisate |
| Polyethylene glycol |
| Polyethylene glycol dimethylether |
| Polypropylene glycol |
| Polyvinylalcohol |
| β-naphthyl polyglycolether |
| Stearic acid polyglycol ester |
| Stearic acid alcohol polyglycolether |

In general, as brightening agents sulfur-containing substances are used which are listed in Table 2:

TABLE 2

| Sulfur compounds |
| --- |
| 3-(Benzothiazolyl-2-thio)-propyl sulfonic acid, sodium salt |
| 3-Mercaptopropane-1-sulfonic acid, sodium salt |
| Ethylene dithiodipropyl sulfonic acid, sodium salt |
| Bis-(p-sulfophenyl)-disulfide, disodium salt |
| Bis-(ω-sulfobutyl)-disulfide, disodium salt |
| Bis-(ω-sulfohydroxypropyl)-disulfide, disodium salt |
| Bis-(ω-sulfopropyl)-disulfide, disodium salt |
| Bis-(ω-sulfopropyl)-sulfide, disodium salt |
| Methyl-(ω-sulfopropyl)-disulfide, disodium salt |
| Methyl-(ω-sulfopropyl)-trisulfide, disodium salt |
| O-ethyldithio-carbonic acid-S-(ω-sulfopropyl)-ester, potassium salt |
| Thioglycolic acid |
| Thiophosphoric acid-O-ethyl-bis-(ω-sulfopropyl)-ester, disodium salt |
| Thiophosphoric acid-(ω-sulfopropyl)-ester, trisodium salt |

As leveling agents polymeric nitrogen compounds (e.g. polyamines or polyamides) or nitrogen-containing sulfur compounds, such as thiourea derivatives or lactam alkoxylate, as described in DE 38 36 521 C2 can be used. The concentrations of the substances used are in a range from 0.1-100 ppm.

Furthermore, also polymeric phenazonium derivatives, which are described in the patent DE 41 26 502 C1, can be used. Further substances which are used for filling blind vias are coloring agents on the basis of an aminotriphenylmethane structure such as malachite, rosalinine or crystal violet.

As anodes for example inert anodes without and with redox system (i.e. with $Fe^{2+/3+}$ system, for example) can be used. When using an iron redox system the concentration of iron(II) ions is 1-15 g/l in general, preferably 8-12 g/l, and the concentration of iron(III) ions is 1-15 g/l in general and preferably 8-12 g/l.

For acidic copper, DC and AC electrolytes also soluble anodes can be used.

During the metallization with copper the metal is deposited not only in the through-holes but also on the surface of the substrate. If desired, the copper layer on the surface can be removed again using the etching processes known in printed circuit board production. To this end, for example solutions containing iron(III) chloride are suitable.

Furthermore, it has been observed that the filling with metals achieves particularly good results in horizontal processes using a special type of metallization by means of a pulse reverse current. This special technique is characterized by a 180° phase shift between the two pulse forms which are generated by two separate pulse rectifiers. By means of the two rectifiers the two sides of a printed circuit board can be individually metallized. A further characteristic consists in the use of a periodically repeating pulse pause for both rectifiers which is chosen such that at the same time the reverse current pulse acts on the other side, cf. FIG. 3.

Reverse pulse plating was developed for the electrolytic deposition of copper in particular on printed circuit boards with a high aspect ratio and is described in DE 42 25 961 C2 and DE 27 39 427 A1, for example. By using high current densities an improved surface distribution and scattering in the through-holes is achieved.

In the inventive process the following parameters are preferably adjusted:

The ratio of the duration of the at least one forward current pulse to the duration of the at least one reverse current pulse is adjusted to at least 5, preferably to at least 15 and more preferably to at least 18. This ratio can be adjusted to 75 at most and preferably to 50 at most. It is particularly preferred to adjust this ratio to about 20.

The duration of the at least one forward current pulse can be adjusted to preferably at least 5 ms to 250 ms.

The duration of the at least one reverse current pulse is preferably adjusted to 20 ms at most and most preferably to 1-10 ms.

The peak current density of the at least one forward current pulse at the workpiece is preferably adjusted to a value of 15 A/dm$^2$ at most. Particularly preferable is a peak current density of the at least one forward current pulse at the workpiece of about 1.5-8 A/dm$^2$ in horizontal processes. In vertical processes the most preferred peak current density of the at least one forward current pulse at the workpiece is 2 A/dm$^2$ at most.

The peak current density of the at least one reverse current pulse at the work piece will preferably be adjusted to a value of 60 A/dm$^2$ at most. Particularly preferred is a peak current density of the at least one reverse current pulse at the workpiece of about 30-50 A/dm$^2$ in horizontal processes. In vertical processes the most preferred peak current density of the at least one reverse current pulse at the workpiece is 3-10 A/dm$^2$ at most.

In a preferred embodiment of the present invention the process comprises the following steps:
a. a first voltage is applied between a first side of the workpiece and at least a first anode so that a first pulse reverse current is supplied to the first side of the workpiece, wherein in every cycle of this first pulse reverse current at least a first forward current pulse and at least a first reverse current pulse flow.
b. a second voltage is applied between a second side of the workpiece and at least a second anode so that a second pulse reverse current is supplied to the second side of the workpiece, wherein in every cycle of this second pulse reverse current at least a second forward current pulse and at least a second reverse current pulse flow.

As regards the latter embodiment the at least one first forward current pulse and the at least one first reverse current pulse, respectively, can be offset relative to the at least one second forward current pulse and to the at least one second reverse current pulse, respectively. In a further preferred embodiment of the present invention this offset between the first and second current pulses amounts to about 180°.

In order to further improve the scattering the current flow in every cycle can comprise two forward current pulses, wherein between the two forward current pulses and a reverse current pulse a zero current interruption is provided.

In the further progress of the metallization process at least one parameter of the pulse reverse current can be varied, wherein this parameter is chosen from a group comprising the ratio of the duration of the forward current pulse to the duration of the reverse current pulse and the ratio of the peak current density of the forward current pulse to the peak current density of the reverse current pulse. It has been proven to be particularly advantageous to increase the ratio of the peak current density of the forward current pulse to the peak current density of the reverse current pulse when metallizing the workpiece and/or to decrease the ratio of the duration of the forward current pulse to the duration of the reverse current pulse.

The invention is further explained by means of the following examples:

Horizontal Metallization Process

The Inpulse® 2 modules of Atotech Deutschland GmbH used for horizontal treatment of printed circuit boards (in which boards for treatment are transported horizontally and in a horizontal transportation plane) have a gap of 15 mm between the nozzle holder and the cathode (workpiece) and a gap of 8 mm between anode and cathode.

For the metallization a printed circuit board of FR4 material is used having the dimensions 18'×24"=457 mm×610 mm and a through-hole diameter of 150 µm and a height of 200 µm, unless stated otherwise.

Prior to metallization the surface of the printed circuit board is first of all cleansed for 45 seconds with the cleaner Cuprapro™ CF of Atotech Deutschland GmbH and then treated for 45 seconds with 5% sulfuric acid.

The electrolytes used have the following composition. The concentration of the copper ions and the sulfuric acid is individually given in the tests. In all cases, the metallization is carried out at a temperature of 40° C.

copper sulfate
sulfuric acid
chloride ions: 50 mg/l
iron(II): 10 g/l
iron(III): 2 g/l
leveling agent Inpulse® H6: 4 ml/l; brightening agent Inpulse® H6: 7 ml/l
leveling agent Inpulse® HF: 4 ml/l; brightening agent Inpulse® HF: 7 ml/l
Inpulse™ leveling agent and brightening agent are products of Atotech Deutschland GmbH.

EXAMPLE 1

According to the above-described general execution rule for horizontal processes the printed circuit board is at first treated for 30 minutes in a bath for electrolytic metallization with copper with the Inpulse® H6 process and a pulse reverse current process with the parameters according to Table 1a. A copper deposition in the through-holes as is shown in FIG. 1a is obtained.

Then, the printed circuit board is treated for a further 30 minutes in a second bath for electrolytic metallization with copper with the Inpulse® HF process and a pulse reverse current process with the parameters according to Table 1b. A copper deposition in the through-holes as is shown in FIG. 2 is obtained.

Then, the filling of the through-holes is complete. No inclusions are observed.

TABLE 1a pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 1a | 6/40 | 108/6 | 6 | 180 | 40 | 200 |
| 1b | 6/40 | 72/4 | 4 | 180 | 60 | 150 |

EXAMPLE 2

According to the above-described general execution rule for horizontal processes the printed circuit board is at first treated for 30 minutes in a bath for electrolytic metallization with copper with the Inpulse® H6 process and a pulse reverse current process with the parameters according to Table 2a.

Then, the printed circuit board is treated for a further 30 minutes in a second bath for electrolytic metallization with copper with the Inpulse® HF process and a pulse reverse current process with the parameters according to Table 2b.

Then, the filling of the through-holes is complete. No inclusions are observed.

TABLE 2a pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 2a | 6/40 | 216/12 | 12 | 180 | 40 | 200 |
| 2b | 6/40 | 72/4 | 4 | 180 | 60 | 150 |

EXAMPLE 3

According to the above-described general execution rule for horizontal processes the printed circuit board is treated for 60 minutes in a bath for electrolytic metallization with copper with the Inpulse® HF process and a pulse reverse current process with the parameters according to Table 3.

Then, the filling of the through-holes is complete. No inclusions are observed.

TABLE 3 pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 3 | 6/40 | 72/4 | 4 | 180 | 60 | 150 |

EXAMPLE 4

According to the above-described general execution rule for horizontal processes a printed circuit board having a through-hole diameter of 200 μm and a height of 300 μm is at first treated for 30 minutes in a bath for electrolytic metallization with copper with the Inpulse® H6 process and a pulse reverse current process with the parameters according to Table 4a.

Then, the printed circuit board is treated for a further 30 minutes in a second bath for electrolytic metallization with copper with the Inpulse® HF process and a pulse reverse current process with the parameters according to Table 4b.

Then, the filling of the through-holes is complete. No inclusions are observed.

TABLE 4 pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 4a | 6/40 | 108/6 | 6 | 180 | 40 | 200 |
| 4b | 6/40 | 72/4 | 4 | 180 | 60 | 150 |

In all tests a pulse pause and a 180° phase shift at the pulse parameter were adjusted. This means that the reverse pulse was applied to the anodes at one side of the test board and that, at the same time, the pulse pause was applied to the anodes of the other side. The schematic representation of the pulse form in FIG. 3 (current as function of the time) shows the adjustment with a phase shift between the upper and the lower anodes (upper curve: current at the upper side of the cathode, bottom curve: current at the bottom side of the cathode).

Vertical Metallization Processes

For the vertical metallization a printed circuit board made from FR4 material is used having the dimensions 18"×24"=457 mm×610 mm and a through-hole diameter of 150 μm and a height of 200 μm.

Before metallization the surface of the printed circuit board is at first cleansed for 3 minutes with an acid cleaner S of Atotech Deutschland GmbH and then treated for 60 seconds with 5% sulphuric acid.

The electrolytes used have the following composition. The concentration of copper ions and sulfuric acid is individually given in the tests. In all cases, the metallization is carried out at a temperature of 23° C.

copper sulfate
sulfuric acid
chloride ions: 60 mg/l in the first step, 35 mg/l in the second.
leveling agent Cuprapulse® XP7: 20 ml/l; brightening agent Cuprapulse® S3:1 ml/l
leveling agent Inplate™ DI: 15 ml/l; brightening agent Inplate™
DI: 0.5 ml/l
Cuprapulse® and Inplate™ leveling agent and brightening agent are products of Atotech Deutschland GmbH.
A redox system is only used in the second step with the following composition:
iron(II): 5 g/l
iron(III): 1 g/l

EXAMPLE 5

According to the above-described general execution rule for vertical processes the printed circuit board is at first treated for 90 minutes in a bath for electrolytic metallization with copper with the Cuprapulse® XP7 process and a pulse reverse current process with the parameters according to Table 5a. Then, in a second step, the printed circuit board is treated for a further 85 minutes in a bath for electrolytic metallization with copper with the Inplate™ DI process and a direct current with the parameters according to Table 5b. Then, the filling of the through-holes is complete. No inclusions are observed.

TABLE 5 pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 5a | 2/8 | 20/1 | — | 0 | 17 | 260 |
| 5b | 1.5 DC | DC | — | — | 40 | 140 |

EXAMPLE 6

According to the above-described general execution rule for vertical processes the printed circuit board is at first treated for 90 minutes in a bath for electrolytic metallization with copper with the Cuprapulse® XP7 process and a pulse reverse current process with the parameters according to Table 6a. Then, in a second step, the printed circuit board is treated for a further 85 minutes in a bath for electrolytic metallization with copper with the Inplate™ DI process and a direct current with the parameters according to Table 6b. Then, the filling of the through-holes is complete. No inclusions are observed.

TABLE 6 pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 6a | 2/8 | 40/2 | — | 0 | 17 | 260 |
| 6b | 1.5 DC | DC | — | — | 40 | 140 |

EXAMPLE 7

According to the above-described general execution rule for vertical processes the printed circuit board is at first treated for 90 minutes in a bath for electrolytic metallization with copper with the Cuprapulse® XP7 process and a pulse reverse current process with the parameters according to Table 7a. Then, in a second step, the printed circuit board is treated for a further 85 minutes in a bath for electrolytic metallization with copper with the Inplate™ DI process and a direct current with the parameters according to Table 7b. Then, the filling of the through-holes is complete. No inclusions are observed.

TABLE 7 pulse parameters in the metallization with copper

| test | $I_{forward}/I_{reverse}$ in A/dm² | pulse parameter in ms forward/reverse pulse | pulse pause in ms | phase shift in ° | copper g/l | sulfuric acid g/l |
|---|---|---|---|---|---|---|
| 7a | 1.5/6 | 20/1 | — | 0 | 17 | 260 |
| 7b | 1.5 DC | DC | — | — | 40 | 140 |

The invention claimed is:

1. Galvanic process for filling through-holes of a workpiece with metals comprising the following steps:
   (i) bringing in contact the workpiece containing through-holes with a metal-deposition electrolyte and applying a voltage between the workpiece and at least one anode so that a current flow is supplied to the workpiece, wherein the current flow is chosen such that a deposition occurs in the center of the through-holes and, consequently, the through-holes completely or almost completely grow together;
   (ii) further bringing in contact the workpiece with a metal-deposition electrolyte and applying a voltage between the workpiece and at least one anode so that a current flow is supplied to the workpiece, wherein the through-holes obtained in step (i), which are divided into to halves are filled by the metal,
      wherein the current flow in accordance with step (i) is a pulse reverse current and in every cycle of the current at least one forward current pulse and at least one reverse current pulse occurs and that the current flow in accordance with step (ii) is either a pulse reverse current, a direct current or an alternating current, and wherein the ratio of the duration of the at least one forward current pulse to the duration of the at least one reverse current pulse is adjusted to 5-75.

2. Process according to claim 1, characterized in that the metallization steps (i) and (ii) are carried out in different electrolytes.

3. Process according to claim 1, characterized in that metallization steps (i) and (ii) are carried out in the same electrolyte.

4. Process according to claim 1, characterized in that the duration of the at least one forward current pulse is adjusted to 5-250 ms.

5. Process according to claim 1, characterized in that the duration of the at least one reverse current pulse is adjusted to 20 ms at most.

6. Process according to claim 1, characterized in that the peak current density of the at least one forward current pulse at the workpiece is adjusted to 15 A/dm$^2$ at most.

7. Process according to claim 1, characterized in that the peak current density of the at least one reverse current pulse at the workpiece is adjusted to 60 A/dm$^2$ at most.

8. Process according to claim 1, characterized in that a first voltage is applied between a first side of the workpiece and at least a first anode so that a first pulse reverse current is supplied to the first side of the workpiece, wherein in every cycle of this first pulse reverse current at least a first forward current pulse and at least a first reverse current pulse flow, and
   a second voltage is applied between a second side of the workpiece and at least a second anode so that a second pulse reverse current is supplied to the second side of the workpiece, wherein in every cycle of this second pulse reverse current at least a second forward current pulse and at least a second reverse current pulse flow.

9. Process according to claim 8, characterized in that the first current pulses are offset relative to the second current pulses by about 180°.

10. Process according to claim 1, characterized in that an acid copper electrolyte is used as electrolyte.

11. Process according to claim 1, characterized in that the electrolyte comprises an inorganic matrix comprising 15-75 g/l copper, 20-400 g/l sulphuric acid and 20-200 mg/l chloride.

12. Process according to claim 1, characterized in that the electrolyte further comprises organic additives selected from brightening agents, leveling agents and wetting agents.

13. Process according to claim 1, characterized in that the electrolyte is operated with inert anodes with a redox system.

14. Process according to claim 1, characterized in that as electrolyte an acid copper electrolyte and as anodes soluble anodes are used.

15. Process according to claim 1, characterized in that the through-holes have a maximum height of 0.05-0.5 mm.

16. Process according to claim 1, characterized in that the through-holes have a diameter of 60 μm-150 μm.

17. Process according to claim 1, characterized in that the workpiece is board-shaped and has through-holes.

18. Process according to claim 1, characterized in that the workpiece is a printed circuit board or any other board-shaped electric circuit carrier.

19. Galvanic process for filling through-holes of a workpiece with metals comprising the following steps:
   (i) bringing in contact the workpiece containing through-holes with a metal-deposition electrolyte and applying a voltage between the workpiece and at least one anode so that a current flow is supplied to the workpiece, wherein the current flow is chosen such that a deposition occurs in the center of the through-holes and, consequently, the through-holes grow together;
   (ii) further bringing in contact the workpiece with a metal-deposition electrolyte and applying a voltage between the workpiece and at least one anode so that a current flow is supplied to the workpiece, wherein the through-holes obtained in step (i) which are divided into two halves are filled by the metal,
      wherein the current flow in accordance with step (i) is a pulse reverse current and in every cycle of the current at least one forward current pulse and at least one reverse current pulse occurs and that the current flow in accordance with step (ii) is either a pulse reverse current, a direct current or an alternating current, and wherein the ratio of the duration of the at least one forward current pulse to the duration of the at least one reverse current pulse is adjusted to 5-75,
      wherein the electrolyte comprises an inorganic matrix comprising 15-75 g/l copper, 20-400 g/l sulphuric acid, and 20-200 mg/l chloride,
      wherein the electrolyte comprises organic additives such as brightening agents, leveling agents and wetting agents, and
      wherein the electrolyte is operated with inert anodes with a redox system.

20. Galvanic process for filling through-holes of a workpieces with metals comprising the following steps:
   (i) bringing in contact the workpiece containing through-holes with a metal-deposition electrolyte and applying a voltage between the workpiece and at least one anode so that a current flow is supplied to the workpiece, wherein the current flow is chosen such that a deposition occurs in the center of the through-holes and, consequently, the through-holes grow together;
   (ii) further bringing in contact the workpiece with a metal-deposition electrolyte and applying a voltage between the workpiece and at least one anode so that a current flow is supplied to the workpiece, wherein the through-holes obtained in step (i) which are divided into two halves are filled by the metal, wherein the current flow in accordance with step (i) is a pulse reverse current and in every cycle of the current at least one forward current pulse and at least one reverse current pulse occurs and that the current flow in accordance with step (ii) is either a pulse reverse current, a direct current or an alternating current, and wherein the ratio of the duration of the at least one forward current pulse to the duration of the at least one reverse current pulse is adjusted to 5-75, wherein the through-holes have a diameter of 60 μm-150 μm. and a maximum height of 0.05-0.5 mm, and wherein the workpiece is a printed circuit board or any other board-shaped electric circuit carrier.

* * * * *